United States Patent
Tsukamoto et al.

(10) Patent No.: US 9,382,612 B2
(45) Date of Patent: Jul. 5, 2016

(54) LANTHANUM TARGET FOR SPUTTERING

(75) Inventors: Shiro Tsukamoto, Ibaraki (JP); Tomio Otsuki, Ibaraki (JP)

(73) Assignee: JX Nippon Mining & Metals Corporation, Tokyo (JP)

(*) Notice: Subject to any disclaimer, the term of this patent is extended or adjusted under 35 U.S.C. 154(b) by 955 days.

(21) Appl. No.: 13/148,324

(22) PCT Filed: Mar. 17, 2010

(86) PCT No.: PCT/JP2010/054494
§ 371 (c)(1),
(2), (4) Date: Aug. 8, 2011

(87) PCT Pub. No.: WO2010/113638
PCT Pub. Date: Oct. 7, 2010

(65) Prior Publication Data
US 2011/0308940 A1   Dec. 22, 2011

(30) Foreign Application Priority Data

Mar. 31, 2009  (JP) .................................. 2009-084078

(51) Int. Cl.
| | |
|---|---|
| *C23C 14/14* | (2006.01) |
| *B22D 21/00* | (2006.01) |
| *B22D 7/00* | (2006.01) |
| *B22D 25/02* | (2006.01) |

(Continued)

(52) U.S. Cl.
CPC ............. *C23C 14/3414* (2013.01); *B21J 1/025* (2013.01); *B21J 1/04* (2013.01); *C22F 1/16* (2013.01); *H01J 37/3426* (2013.01)

(58) Field of Classification Search
CPC ........ C23C 14/3414; C23C 14/34; C22F 1/16
USPC .......................................................... 148/557
See application file for complete search history.

(56) References Cited

U.S. PATENT DOCUMENTS

| | | |
|---|---|---|
| 5,074,935 A | 12/1991 | Masumoto et al. |
| 7,156,963 B2 | 1/2007 | Oda |

(Continued)

FOREIGN PATENT DOCUMENTS

| | | |
|---|---|---|
| CN | 1243171 A | 2/2000 |
| CN | 1552939 A | 12/2004 |

(Continued)

OTHER PUBLICATIONS

Machine translation of SU 511119A, Jul. 1976.*

(Continued)

*Primary Examiner* — Jie Yang
*Assistant Examiner* — Xiaowei Su
(74) *Attorney, Agent, or Firm* — Howson & Howson LLP

(57) ABSTRACT

Provided are a lanthanum target for sputtering which has a recrystallized structure with an average crystal grain size of 100 μm or less and has no spotty macro patterns on the surface; and a method of producing a lanthanum target for sputtering, wherein lanthanum is melted and cast to produce an ingot, the ingot is subject to knead forging at a temperature of 300 to 500° C. and subsequently subject to hot upset forging to form the shape into a rough target shape, and this is additionally subject to machining to obtain a target. This invention aims to offer technology for efficiently and stably providing a lanthanum target for sputtering which has no spotty macro patterns on the surface, and a method of producing the same.

9 Claims, 6 Drawing Sheets

(51) Int. Cl.
*C23C 14/34* (2006.01)
*B21J 1/02* (2006.01)
*B21J 1/04* (2006.01)
*C22F 1/16* (2006.01)
*H01J 37/34* (2006.01)

(56) References Cited

U.S. PATENT DOCUMENTS

| | | | |
|---|---|---|---|
| 7,716,806 B2 | 5/2010 | Oda | |
| 7,740,717 B2 | 6/2010 | Oda | |
| 8,038,911 B2 | 10/2011 | Inoue et al. | |
| 2001/0015243 A1 | 8/2001 | Shima et al. | |
| 2003/0052000 A1* | 3/2003 | Segal et al. | 204/298.13 |
| 2005/0252268 A1* | 11/2005 | Michaluk | C22F 1/18 72/365.2 |
| 2007/0003790 A1 | 1/2007 | Tsukatani et al. | |
| 2007/0062806 A1 | 3/2007 | Oda | |
| 2007/0209741 A1 | 9/2007 | Carpenter et al. | |
| 2007/0209930 A1* | 9/2007 | Chua et al. | 204/298.02 |
| 2007/0240795 A1 | 10/2007 | Sato et al. | |
| 2008/0032320 A1 | 2/2008 | Nakagawara et al. | |
| 2008/0063889 A1* | 3/2008 | Duckham et al. | 428/615 |
| 2008/0121522 A1 | 5/2008 | Ehira et al. | |
| 2008/0223718 A1 | 9/2008 | Takagi et al. | |
| 2009/0057139 A1 | 3/2009 | Fukushima et al. | |
| 2010/0108500 A1* | 5/2010 | Hawrylchak et al. | 204/298.13 |
| 2010/0272596 A1 | 10/2010 | Takahata et al. | |
| 2011/0114481 A1 | 5/2011 | Satoh et al. | |
| 2011/0114482 A1 | 5/2011 | Satoh et al. | |
| 2011/0162322 A1 | 7/2011 | Satoh et al. | |
| 2011/0290644 A1 | 12/2011 | Tsukamoto et al. | |
| 2012/0045380 A1 | 2/2012 | Satoh et al. | |
| 2013/0241010 A1 | 9/2013 | Takahata et al. | |
| 2013/0277214 A1 | 10/2013 | Narita et al. | |
| 2013/0313659 A1 | 11/2013 | Takahata et al. | |
| 2014/0199203 A1 | 7/2014 | Takahata et al. | |

FOREIGN PATENT DOCUMENTS

| | | | |
|---|---|---|---|
| JP | H09-104972 A | | 4/1997 |
| JP | 2000-345327 A | | 12/2000 |
| JP | 2007-009288 A | | 1/2007 |
| JP | 2007-169683 A | | 7/2007 |
| SU | 511119 A | * | 7/1976 |
| WO | 2009/084318 A1 | | 7/2009 |

OTHER PUBLICATIONS

Hanak et al. Physics Letters, 1969, vol. 30A, p. 201-202.*
Balster et al. Journal of Low Temperature Physics, 1975, vol. 21, p. 377-414.*
Bohlander, Mechanical fabrication of rare earth metal, Nov. 3, 1959, p. 1-24.*
Fort, Journal of the Less-Common Metals, 1981, vol. 81, p. 273-292.*
Simmons, The mechanical properties of Yittrium, scandium and the rare earth metals, Nov. 1959.*
E. Tokumitsu et al., "A Study on High-Dielectric-Constant Oxide Materials for MOSFET Gate Insulator Applications", Denshi-zairyo Kenkyu-kai Shiryo of Institute of Electrical Engineers of Japan, vol. 6-13, pp. 37-41, Sep. 21, 2000.
Koji Mimura et al., "High Purification of Neodymium and Lanthanum by Electron Beam Floating Zone Melting", the Shigen-Sozai, vol. 1993, No. 1, pp. 3-6, 1993 (month unknown).
Nakahara, "Lanthanum", Mukikagoubuitsu/sakutai Jiten, Kodan-sha Ltd., p. 996, Jun. 10, 1987.
K. Shima, "Process of High-Purity Metals and Physical Property", CMC Publishing Co., Ltd., Trade Edition, 1st Printing, pp. 8 and 124-129, Dec. 2000.
G. Bruzzone et al., "The Lanthanum-Cadium System", Journal of the Less-Common Metals, vol. 30, pp. 303-305, 1973 (month unknown).
L.I. Bol'Shutkin et al., "Temperature Dependence of the Hardness of Lanthanum and Neodymium in the Range 77-293 K", The Physics of Metals and Metallography, vol. 20, No. 3, pp. 151-154, 1965 (month unknown).

* cited by examiner (X 200)

(X 200)

(X 200)

(X 200)

LANTHANUM TARGET FOR SPUTTERING

BACKGROUND OF THE INVENTION

The present invention relates to a lanthanum target for sputtering that has no spotty macro patterns on the surface, and to a method of producing the same.

Lanthanum (La) is one of the rare-earth elements, and is a mineral resource that is contained in the earth's crust as a mixed composite oxide. Rare-earth elements are so called because they are separated from relatively rare minerals, but they are not that rare in light of the overall earth's crust.

Lanthanum is a white metal having an atomic number of 57 and an atomic weight of 138.9, and comprises a double hexagonal close-packed structure at normal temperature.

Lanthanum has a melting point of 921° C., boiling point of 3500° C., and density of 6.15 g/cm$^3$. Its surface is oxidized in the atmosphere, and lanthanum gradually melts in water. Lanthanum is soluble in hot water and acid. Although it is not ductile, it is slightly malleable. The resistivity is $5.70 \times 10^{-6}$ Ωcm, and lanthanum becomes an oxide ($La_2O_3$) when burned at 445° C. or higher (refer to Dictionary of Physics and Chemistry).

With rare-earth elements, it is generally said that compounds with the oxidation number 3 are stable, and lanthanum is also trivalent. Lanthanum is a metal that is attracting attention as an electronic material such as a metal gate material or a high-dielectric (High-k) material, and research and development is recently being promoted (refer to Non Patent Document 1).

Lanthanum metal is a material in which high purification is difficult to achieve since it is easily oxidized during the refining process. In addition, if lanthanum metal is left in the atmosphere, there is a problem in that the handling thereof is difficult since it will become oxidized and darkly-discolored in a short period of time.

In recent years, thinning of a gate insulator film in the next-generation MOSFET is being demanded, but with the $SiO_2$ that has been conventionally used as the gate insulator film, the leak current will increase due to the tunnel effect, and normal operation is becoming difficult.

Thus, as a substitute for the $SiO_2$ described above, $HfO_2$, $ZrO_2$, $Al_2O_3$ and $La_2O_3$ with high dielectric constant, high thermal stability, and high energy barrier against the holes and electrons in the silicon have been proposed. In particular, among the foregoing materials, $La_2O_3$ is valued highly and its electrical properties have been investigated. And its use as a gate insulator film in the next-generation MOSFET has been studied and reported (refer to Non Patent Document 1). Nevertheless, with Non Patent Document 1, the subject of research is a $La_2O_3$ film, and it does not make any reference to the properties and behavior of La element.

Moreover, Patent Document 1 relates to lanthanum primarily for use as a target material (and the production method thereof). Although it describes producing a target with lanthanum, it could not be used as a reference since there was no specific description concerning the method (conditions) of producing such a target.

It could be said that lanthanum (lanthanum oxide) is still in the research phase, but when studying the properties of such lanthanum (lanthanum oxide), if lanthanum metal itself exists as a target material for sputtering, it is possible to form a lanthanum thin film on a substrate. It will also be easy to study the behavior at the interface with the silicon substrate, and additionally study the properties of a high-dielectric gate insulator film or the like by forming a lanthanum compound, and there is also a significant advantage in that the freedom of the target as a product will increase.

Nevertheless, even if a lanthanum target for sputtering is prepared, as described above, it becomes oxidized in a short period of time (approximately 10 minutes) in the atmosphere. When an oxide film is formed on the target, the electrical conductivity will deteriorate and thereby cause defective sputtering. In addition, if the lanthanum sputtering target is left in the atmosphere for a long period of time, it reacts with the moisture in the air and becomes covered with white hydroxide powder, and it may even cause a problem of not allowing normal sputtering to be performed. Thus, measures Nevertheless, even if the foregoing problems can be resolved, there are other problems. Specifically, at the stage of preparing a target from the molten ingot, spotty macro patterns (unevenly colored macro patterns) appear on the machined surface of the lanthanum target. FIG. 1 shows a photograph of the lanthanum target with spotty macro patterns on the surface.

In FIG. 1, the generation of spotty macro patterns (appearing like cloud) can be observed at the part slightly outside the center of target and the outlying part of target. This is a coarsened structure as shown in the Comparative Examples described later, and is an imbalanced structure in comparison to the other parts of the material.

This causes the problem of uneven deposition during sputtering and the problem of causing the generation of particles. Accordingly, it is necessary to take measures for preventing the occurrence of such spotty macro patterns, but the problem could not be resolved to date. In addition, the current situation is that there is no recognition that this kind of problem even exists in a lanthanum target.

[Non Patent Document 1] Written by Eisuke Tokumitsu and two others, "Research on Oxide Material for High-k Gate Insulator Film", The Institute of Electrical Engineers of Japan, Research Paper of Electronic Materials, Vol. 6-13, Pages 37 to 41, Published on Sep. 21, 2001

[Patent Document 1] International Publication No. WO2009/084318

SUMMARY OF THE INVENTION

An object of this invention is to offer technology for efficiently and stably providing a lanthanum target for sputtering which has no spotty macro patterns on the surface, and a method of producing the same.

As described in the section of Background Art above, lanthanum is a material of which surface is susceptible to spotty macro patterns during the process of producing the target, but the present inventors discovered that the occurrence of spotty macro patterns on the surface can be reduced by increasing the hardness of the lanthanum target and maintaining a certain level of hardness. With respect to this discovery, the Applicant is scheduled to file an application as a new invention.

Nevertheless, the present inventors confirmed, through numerous experiments, that it is possible to provide a lanthanum target for sputtering which has no spotty macro patterns on the surface even if the Vickers hardness is not 60 or more. This can be achieved by causing the structure of the lanthanum target for sputtering to be a recrystallized structure having an average crystal grain size of 100 μm or less.

It is thereby possible to obtain a lanthanum target for sputtering which has no spotty macro patterns on the surface, and realize the uniformity of deposition during sputtering, as well as effectively inhibit the generation of particles.

A LaOx film is mainly formed for use as a gate insulator film in MOSFET. Nevertheless, when forming this kind of film, lanthanum metal is required in order to form an arbitrary film or to increase the freedom in forming the film. The present invention is able to provide a target material capable of complying with the foregoing requirement.

Although it is desirable to use a high-purity material as the raw material of lanthanum that is used in the present invention, impurities that are normally contained are tolerated. In particular, the rare-earth elements contained in lanthanum include Sc, Y, Ce, Pr, Nd, Pm, Sm, Eu, Gd, Tb, Dy, Ho, Er, Tm, Yb, and Lu in addition to lanthanum (La), but it is difficult to separate and refine these elements from La since they have similar properties. In particular, since Ce is approximate to La, it is difficult to reduce Ce. Nevertheless, since these rare-earth elements have approximate properties, so as long as the total amount of rare-earth elements is less than 1000 wtppm, there is no particular problem when used as an electronic component material.

Accordingly, the lanthanum target of the present invention can tolerate the inclusion of rare-earth elements at the foregoing level. Nevertheless, in order to take advantage of the properties of the lanthanum element, it could be said that the total amount of rare-earth elements excluding lanthanum is preferably 100 wtppm or less, more preferably 10 wtppm or less, and, even more preferably, the content of each rare-earth element is 1 wtppm or less. The present invention is able to achieve and covers all of the above.

Generally speaking, C, N, O, S, and H exist as gas components. These gas components may exist as independent elements, but in many cases they exist as compounds ($CO$, $CO_2$, $SO_2$ and so on) or sometimes exist in the form of compounds with the constituent elements. Since these gas component elements have a small atomic weight and atomic radius, so as long as they are not contained in large amounts, they will hardly affect the properties of the material even when existing as impurities. Accordingly, when indicating the purity, it is common practice to indicate the purity excluding gas components.

In this respect, the lanthanum of the present invention achieves a purity of 4N or higher excluding gas components. With lanthanum refined to this level, the gas components will also decrease proportionately. For instance, there will be no particular problem if the amount of oxygen contained in the lanthanum is 2000 wtppm or more, or in certain cases 5000 wtppm or less.

Nevertheless, it should be understood that the present invention is not aiming to achieve an oxygen content in the vicinity of 5000 wtppm. Specifically, it goes without saying that it is desirable for the amount of oxygen to be as low as possible. The present invention aims to achieve an oxygen content of 1500 wtppm or less and even less than 1000 wtppm, and has achieved the foregoing figures.

Moreover, the lanthanum target of the present invention preferably has a purity of 4N or higher excluding rare-earth elements and gas components. In particular, it is preferable that the amounts of aluminum, iron and copper in the lanthanum are respectively 100 wtppm or less, oxygen content is 1500 wtppm or less, elements of alkali metals and alkali earth metals are respectively 1 wtppm or less, elements of transition metals and high-melting-point metals other than the foregoing elements are respectively 10 wtppm or less, and radioactive elements are respectively 10 wtppb or less.

Upon producing the lanthanum target for sputtering, lanthanum as the raw material is melted and cast to produce an ingot, the ingot is subject to knead forging at a temperature of 300 to 500° C. and subsequently subject to upset forging or warm rolling at 300 to 500° C. to form the shape into a rough target shape, this is subject to heat treatment at a temperature of 150 to 300° C. to achieve recrystallization, and this is additionally subject to machining to obtain a target as a lanthanum target for sputtering. Note that the foregoing knead forging is hot forging in which considerable strains are applied alternately from the longitudinal direction and lateral direction in order to destroy the cast structure of the ingot.

It is thereby possible to produce a lanthanum target for sputtering which has a recrystallized structure with an average crystal grain size of 100 µm or less and has no spotty macro patterns on the surface. If the average crystal grain size of the recrystallized structure exceeds 100 µm, spotty macro patterns will occur. An average crystal grain size of 100 µm or less is an essential requirement. This is further cut into a predetermined size and subject to the grinding process in order to obtain a sputtering target.

The present invention relates to a lanthanum target for sputtering which has a recrystallized structure with an average crystal grain size of 100 µm or less and has no spotty macro patterns on the machined surface. If sputtering is performed with the lanthanum target obtained as described above, superior effects are yielded in that uniform deposition is enabled and the generation of particles is inhibited.

DETAILED DESCRIPTION OF THE INVENTION

Figure 1:
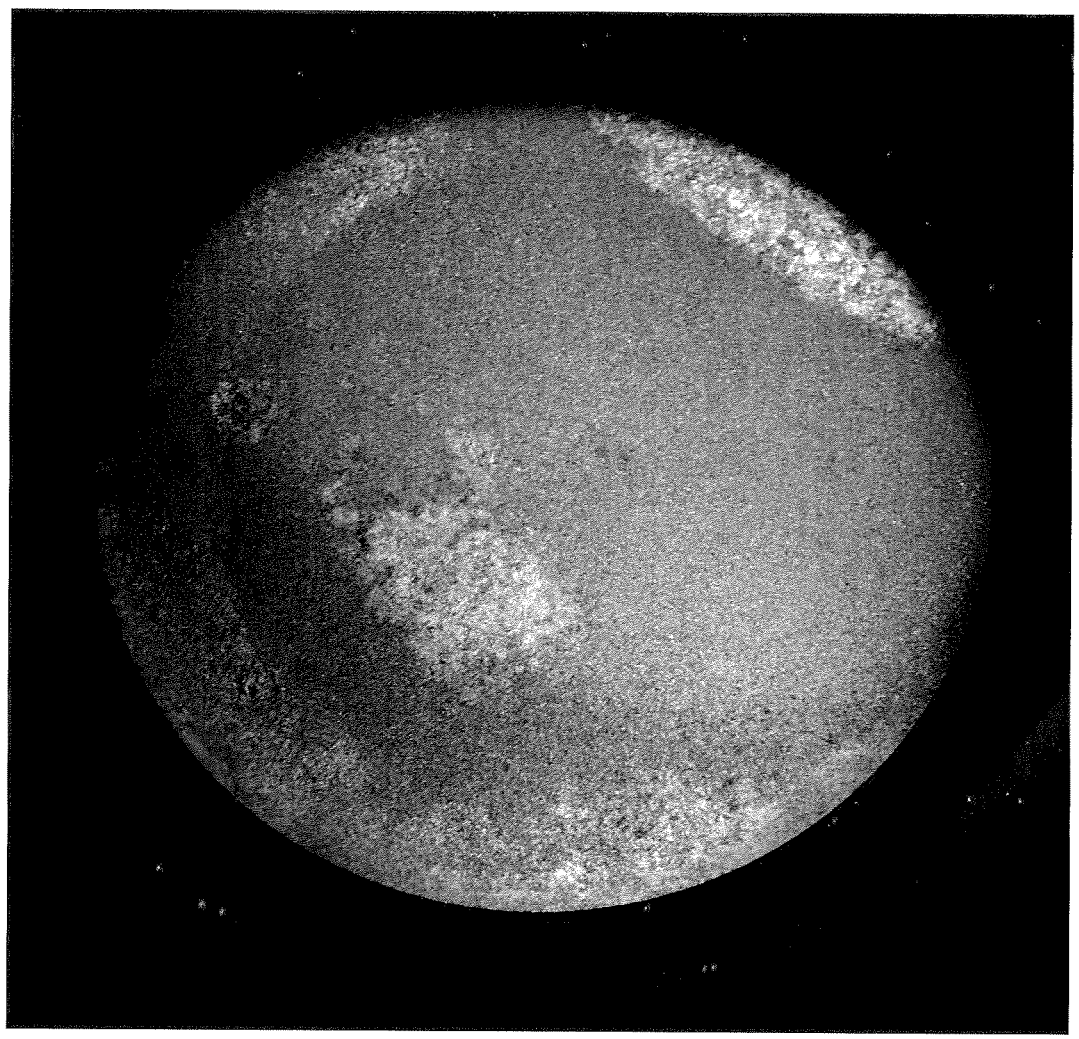
FIG. 1 is a photograph showing the spotty macro patterns (unevenly colored macro patterns) on the machined target surface.

In the present invention, the average crystal grain size of the recrystallized structure of the target is refined, and the spotty macro patterns are eliminated from the lanthanum target. The production process is important in order to refine the average crystal grain size of the recrystallized structure.

In order to produce the lanthanum target for sputtering of the present invention, lanthanum is melted and cast (solidified) to produce an ingot. The obtained ingot is subsequently subject to knead forging at a temperature of 300 to 500° C.

With conventional processing methods, under normal circumstances, the ingot is directly subject to forging at a high temperature (around 800° C.) and formed into a target shape, and subsequently subject to machining to produce the target. Nevertheless, since lanthanum is soft and possesses ductility, there is a problem in that a material produced under the foregoing forging conditions is subject to "burr" during the machining process and this remains on the lanthanum target surface.

Moreover, with conventional production methods, there is a problem in that spotty macro patterns appear on the machined lanthanum surface. If there are spotty macro patterns or "burr" on the lanthanum target surface as described above, there is a major problem in that particles are generated during sputtering and uniform deposition cannot be achieved. In addition, even though the lanthanum ingot has favorable workability, it was difficult to increase the diameter; that is, to produce a target with a diameter of 300 mm or more only with the foregoing forging conditions.

In substitute for the problematic conventional production methods described above, the present inventors, as a result of conducting numerous experiments, devised the production conditions and achieved a lanthanum target for sputtering that has no spotty macro patterns on the surface.

Specifically, lanthanum is melted and cast to produce an ingot, the ingot is subject to knead forging at a temperature of 300 to 500° C. and subsequently subject to upset forging at 300 to 500° C. to form the shape into a rough target shape, this is subject to heat treatment at a temperature of 150 to 300° C. to achieve recrystallization, and this is additionally subject to machining to obtain a target.

This process is a unique feature of the present invention. By once destroying and work hardening the structure of the material during the foregoing knead forging, and thereafter performing the foregoing heat treatment to the forged material with strains accumulated therein, it is possible to achieve a fine crystal grain size.

Moreover, based on the process of performing upset forging or warm rolling to form the shape into a rough target shape, the diameter of the target can be made to be 300 mm or more. The usage of the lanthanum target can be further expanded thereby and the operating efficiency can be improved.

Other than the foregoing process, a recrystallized structure of the lanthanum target for sputtering can also be achieved by the following process; namely, lanthanum is melted and cast to produce an ingot, the ingot is subject to knead forging at a temperature of 300 to 500° C. and subsequently subject to upset forging or warm rolling at 300 to 500° C. to form the shape into a rough shape of a target and achieve recrystallization, and this is additionally subject to machining to obtain a target. In addition, it can also be achieved by the following process; namely, lanthanum is melted and cast to produce an ingot, the ingot is subject to knead forging at a temperature of 300 to 500° C. and subsequently subject to warm rolling at 300 to 500° C. to form the shape into a rough target shape, this is subject to heat treatment at a temperature of 300 to 500° C. to achieve recrystallization, and this is additionally subject to machining to obtain a target. The present invention is to obtain a predetermined recrystallized structure based on the foregoing methods, and covers all of the foregoing aspects.

This is further subject to machining to obtain a target. Finish processing (grinding) may also be subsequently performed as needed.

Consequently, it is possible to obtain a lanthanum target for sputtering which has a recrystallized structure with an average crystal grain size of 100 µm or less. Although the hardness of the lanthanum target prepared as described above has decreased, no spotty macro patterns were observed on the surface.

Accordingly, it is evident that there is a strong correlation between the lanthanum target itself having a recrystallized structure with an average crystal grain size of 100 µm or less, and the operation (function) of machining to enable the inhibition of occurrence of patcy macro patterns. Although the effect of preventing the spotty macro patterns is not necessarily explainable theoretically, it is considered that the fine target structure is a direct cause thereof.

Since a major difference as described above can be acknowledged in the structure of the lanthanum target of the present invention, in order to examine such difference, the crystal orientation of the structure was observed based on X-ray diffraction (XRD). Nevertheless, with XRD, a significant difference could not be acknowledged.

Nevertheless, the lanthanum target of the present invention often achieved a result where the peak intensity of (100) is stronger than the peak intensity of (101) in comparison to the lanthanum targets obtained with the conventional production method described later, but some cases did not reach such result. The results will be explained once again in the Examples and Comparative Examples described later.

With the lanthanum target of the present invention, the prepared target is bonded with a backing plate, but the target is generally bonded with a copper (so-called OFC "oxygen-free copper") backing plate based on diffusion bonding (DB) rather than brazing.

Nevertheless, it is desirable to use a copper-chromium (Cu-1% Cr) alloy backing plate so as to prevent any peeling or floating of the bond part. When this kind of copper-chromium alloy backing plate is used, favorable bonding can be performed without causing any peeling or floating of the bond part between the target and the backing plate during sputtering. The use of this backing plate is a unique feature of the lanthanum target of the present invention.

EXAMPLES

The Examples of the present invention are now explained. Incidentally, the Examples are merely for facilitating the understanding of the invention, and the present invention shall in no way be limited thereby. In other words, various modifications and other embodiments based on the technical spirit claimed in the claims shall be covered by the present invention as a matter of course.

Example 1

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 400° C. and additionally subject to upset forging at a temperature of 300° C. to increase its diameter and form the shape into a rough target shape, and this was further subject to heat treatment at 180° C. for 1 hour to obtain a recrystallized structure.

This was further subject to machining to obtain a disk-shaped target of φ140×14 t (units are all mm; hereinafter the same). The weight of this target was 1.42 kg. This target was further diffusion-bonded to a copper-chromium alloy backing plate to obtain a lanthanum target for sputtering.

Consequently, it was confirmed that it is desirable to subject the ingot to knead forging and upset forging at a temperature of 300 to 500° C. to achieve recrystallization.

Figure 2:
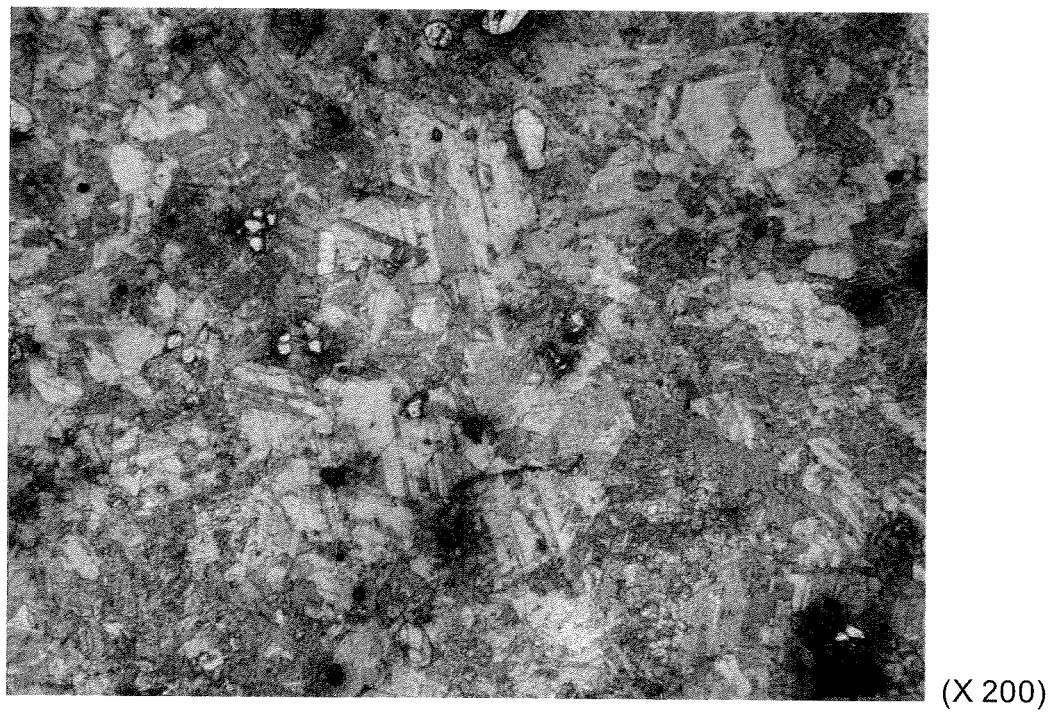
FIG. 2 is a micrograph (×200) of the machined target surface of Example 1 of the present invention.

In order to observe the structure of the lanthanum target for sputtering obtained as described above, etching was performed using 1 wt % nitric acid aqueous solution. FIG. 2 shows the micrograph (×200) showing the results. The structure of the target was a recrystallized structure. The crystal grain size was 20 to 30 μm. The average crystal grain size was 25 μm, and satisfied the conditions of the present invention. As shown in FIG. 2, spotty macro patterns were not observed on the surface of the lanthanum target for sputtering.

By way of reference, the Vickers hardness in this case was 49, but spotty macro patterns were not observed even with this kind of low hardness. This is considered to be a result that the fine recrystallized structure has a great impact on the prevention of the spotty macro patterns.

Figure 3:
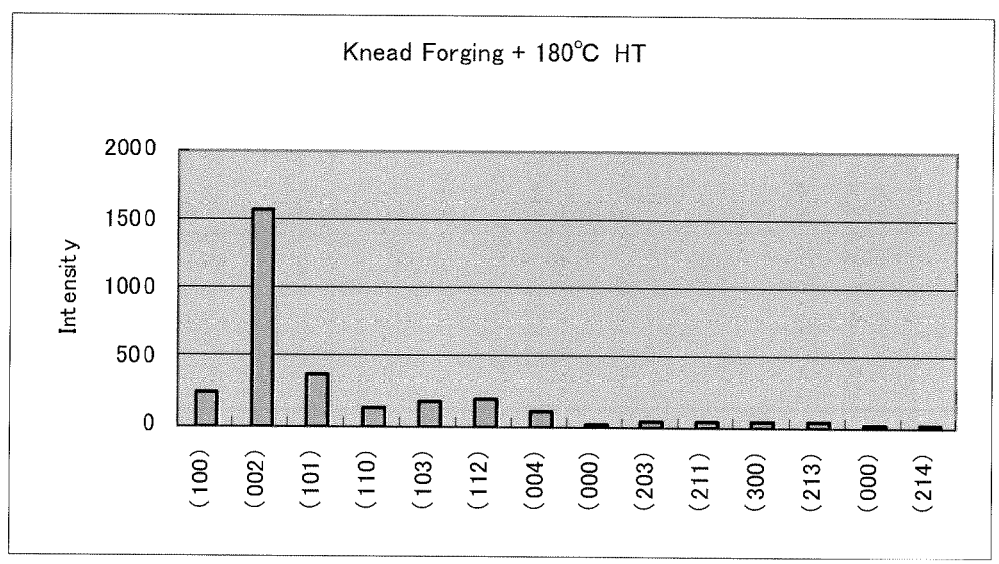
FIG. 3 is a diagram showing the peak of the crystal orientation of Example 1 of the present invention based on XRD.

Meanwhile, FIG. 3 shows the results of measuring the crystal orientation of the lanthanum target for sputtering obtained in this Example based on X-ray diffraction (XRD). In comparison to the lanthanum target of Comparative Example 1 described later, other than that the peak intensity of (101) was stronger than the peak intensity of (100), there was no significant difference in the results. Consequently, it is considered that the difference in crystal orientation does not greatly affect the generation of spotty macro patterns in the present invention.

In addition, the lanthanum target for sputtering was sputtered under the condition of 100 W power. Consequently, a uniform film was formed on the substrate without generating any particles. Moreover, even when sputtering was performed for a long period of time, favorable sputtering was enabled without the target floating from the backing plate and without any peeling between the target and the backing plate. Consequently, it was confirmed that diffusion bonding with the copper-chromium alloy backing plate is effective.

Example 2

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 500° C. and additionally subject to upset forging at a temperature of 400° C. to increase its diameter and form the shape into a rough target shape, and this was further subject to heat treatment at 290° C. for 1 hour to obtain a recrystallized structure.

This was further subject to machining to obtain a disk-shaped target of φ140×14 t. The weight of this target was 1.42 kg. This target was further diffusion-bonded to a copper-chromium alloy backing plate to obtain a lanthanum target for sputtering.

Figure 4:
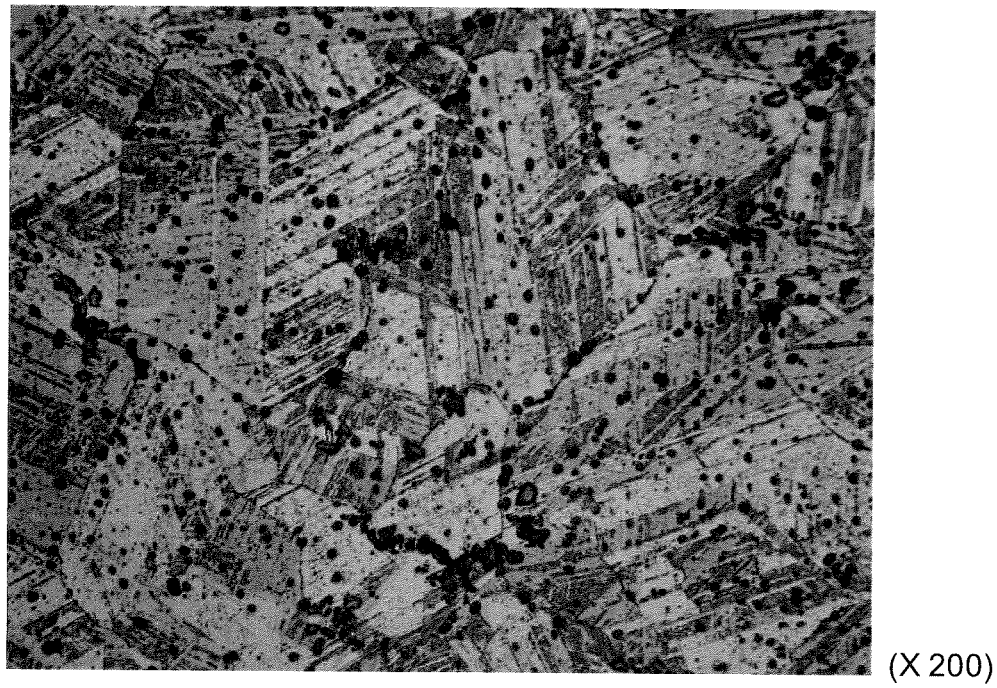
FIG. 4 is a micrograph (×200) of the machined target surface of Example 2 of the present invention.

Subsequently, in order to observe the structure of the lanthanum target for sputtering obtained as described above, etching was performed using 1 wt % nitric acid aqueous solution. FIG. 4 shows the micrograph (×200) showing the results. The structure of the target was a recrystallized structure. The average crystal grain size was 100 μm, and satisfied the conditions of the present invention. As shown in FIG. 4, spotty macro patterns were not observed on the surface of the lanthanum target for sputtering. Consequently, it was confirmed that it is desirable to perform heat treatment at 290° C. for 1 hour after forging.

By way of reference, the Vickers hardness in this case was 38, but spotty macro patterns were not observed even with this kind of low hardness. This is considered to be a result of the fine recrystallized structure has a great impact on the prevention of the spotty macro patterns.

Figure 5:
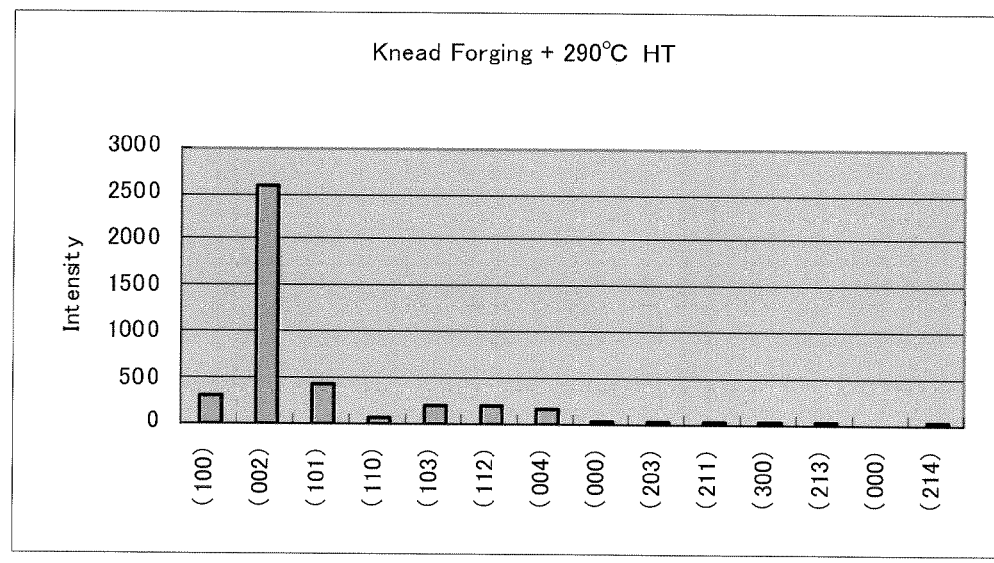
FIG. 5 is a diagram showing the peak of the crystal orientation of Example 2 of the present invention based on XRD.

Meanwhile, FIG. 5 shows the results of measuring the crystal orientation of the lanthanum target for sputtering obtained in this Example based on X-ray diffraction (XRD). In comparison to the lanthanum target of Comparative Example 1 described later, other than that the peak intensity of (101) was stronger than the peak intensity of (100), there was no significant difference in the results. Consequently, it is considered that the difference in crystal orientation does not greatly affect the generation of spotty macro patterns in the present invention.

In addition, the lanthanum target for sputtering was sputtered under the condition of 100 W power. Consequently, a uniform film was formed on the substrate without generating any particles. Moreover, even when sputtering was performed for a long period of time, favorable sputtering was enabled without the target floating from the backing plate and without any peeling between the target and the backing plate. Consequently, it was confirmed that diffusion bonding is effective for the copper-chromium alloy backing plate.

Example 3

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 300° C. and additionally subject to warm rolling at a temperature of 400° C. to increase its diameter, form the shape into a rough target shape and obtain a recrystallized structure.

This was further subject to machining to obtain a disk-shaped target of φ140×14 t. The weight of this target was 1.42 kg. This target was further diffusion-bonded to a copper-chromium alloy backing plate to obtain a lanthanum target for sputtering.

Figure 6:
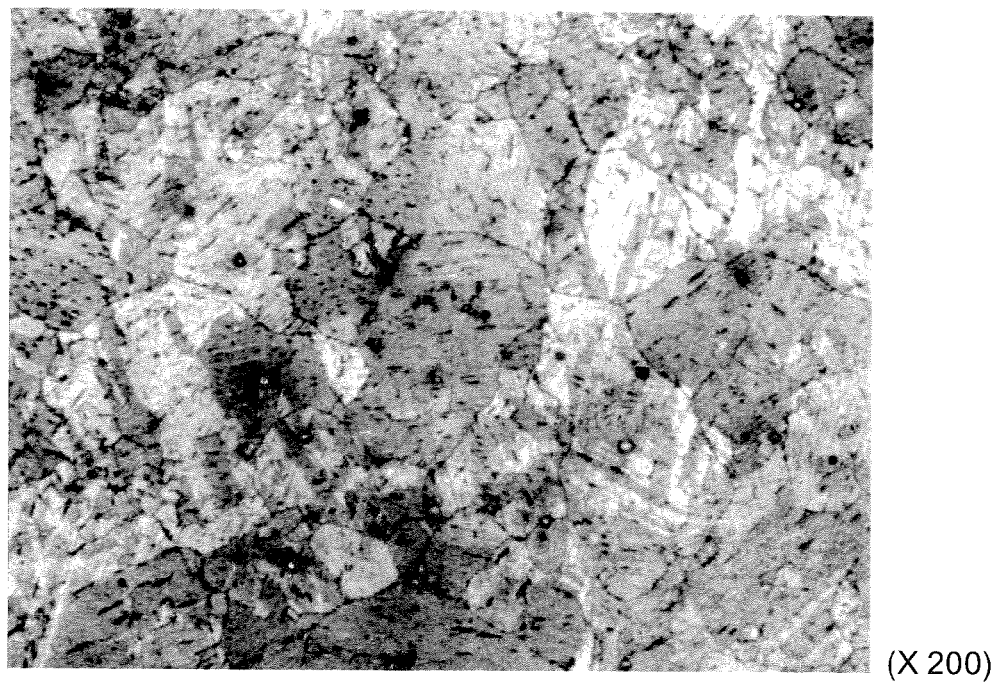
FIG. 6 is a micrograph (×200) of the machined target surface of Example 3 of the present invention.

Subsequently, in order to observe the structure of the lanthanum target for sputtering obtained as described above, etching was performed using 1 wt % nitric acid aqueous solution. FIG. 6 shows the micrograph (×200) showing the results. The structure of the target was a recrystallized structure. The average crystal grain size was 40 to 60 μm, and satisfied the conditions of the present invention. As shown in FIG. 6, spotty macro patterns were not observed on the surface of the lanthanum target for sputtering. Consequently, it was confirmed that it is desirable to subject the ingot to knead forging and subsequent warm rolling at a temperature of 300 to 500° C.

By way of reference, the Vickers hardness in this case was 46, but spotty macro patterns were not observed even with this kind of low hardness. This is considered to be a result of the fine recrystallized structure has a great impact on the prevention of the spotty macro patterns.

Figure 7:
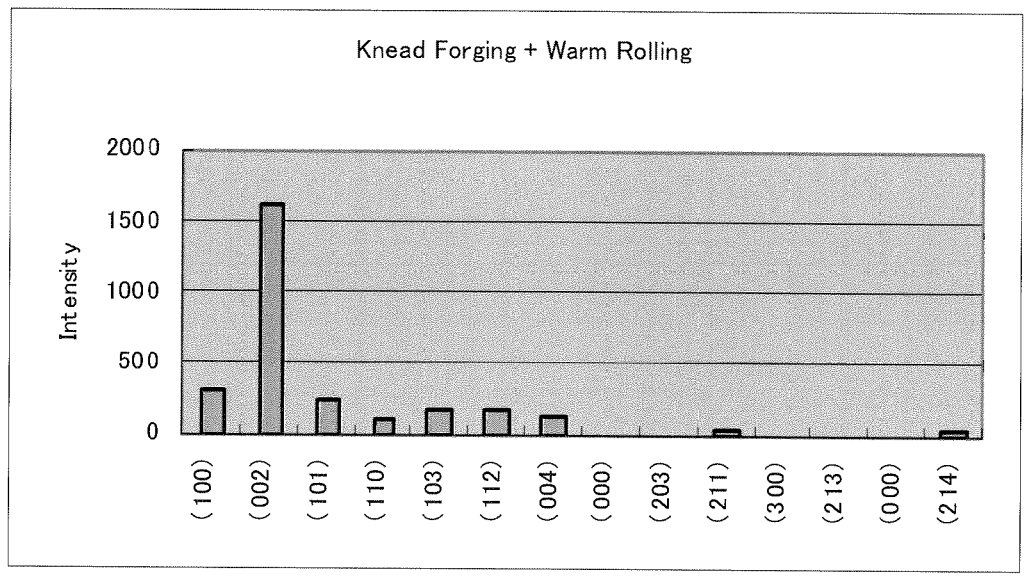
FIG. 7 is a diagram showing the peak of the crystal orientation of Example 3 of the present invention based on XRD.

Meanwhile, FIG. 7 shows the results of measuring the crystal orientation of the lanthanum target for sputtering obtained in this Example based on X-ray diffraction (XRD). In comparison to the lanthanum target of Comparative Example 1 described later, other than that the peak intensity of (101) was stronger than the peak intensity of (100), there was no significant difference in the results. Consequently, it is considered that the difference in crystal orientation does not greatly affect the generation of spotty macro patterns in the present invention.

In addition, the lanthanum target for sputtering was sputtered under the condition of 100 W power. Consequently, a uniform film was formed on the substrate without generating any particles. Moreover, even when sputtering was performed for a long period of time, favorable sputtering was enabled without the target floating from the backing plate and without any peeling between the target and the backing plate. Consequently, it was confirmed that diffusion bonding is effective for the copper-chromium alloy backing plate.

Example 4

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 400° C. and additionally subject to warm rolling at a temperature of 400° C. to increase its diameter and form the shape into a rough target shape, and this was further subject to heat treatment at 300° C. to obtain a recrystallized structure.

This was further subject to machining to obtain a disk-shaped target of $\phi 140 \times 14$ t. The weight of this target was 1.42 kg. This target was further diffusion-bonded to a copper-chromium alloy backing plate to obtain a lanthanum target for sputtering.

Figure 8:
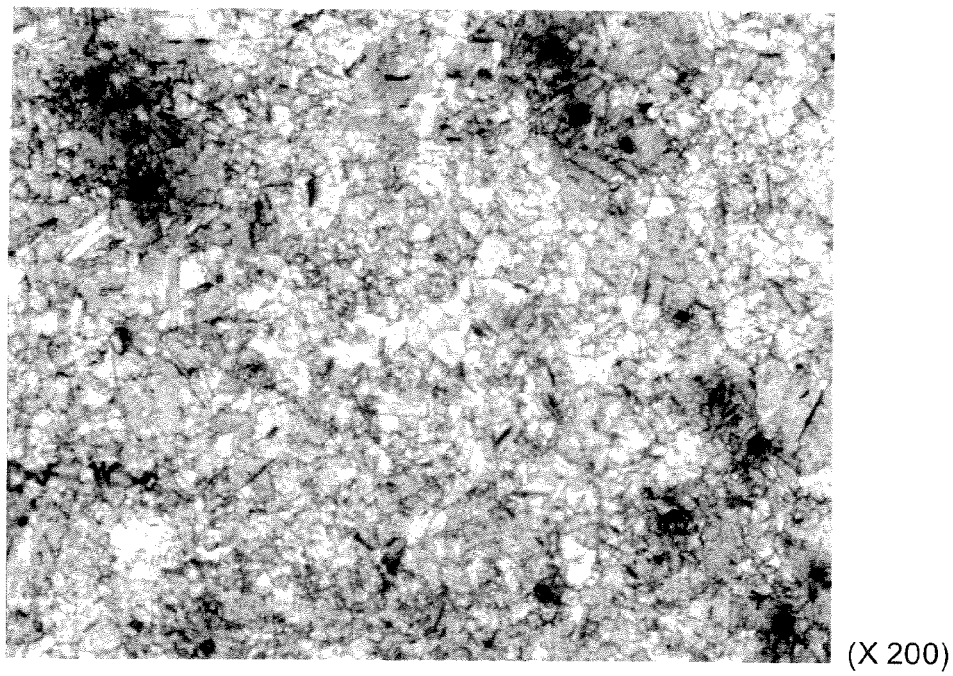
FIG. 8 is a micrograph (×200) of the machined target surface of Example 4 of the present invention.

Subsequently, in order to observe the structure of the lanthanum target for sputtering obtained as described above, etching was performed using 1 wt % nitric acid aqueous solution. FIG. 8 shows the micrograph (×200) showing the results. The structure of the target was a recrystallized structure. The crystal grain size was 10 to 150 µm, and satisfied the conditions of the present invention.

As shown in FIG. 8, spotty macro patterns were not observed on the surface of the lanthanum target for sputtering. Consequently, it was confirmed that it is desirable to subject the ingot to knead forging and subsequent warm rolling at a temperature of 300 to 500° C., and additional heat treatment at 300° C. for achieving recrystallization.

By way of reference, the Vickers hardness in this case was 42, but spotty macro patterns were not observed even with this kind of low hardness. This is considered to be a result of the fine recrystallized structure has a great impact on the prevention of the spotty macro patterns.

Figure 9:
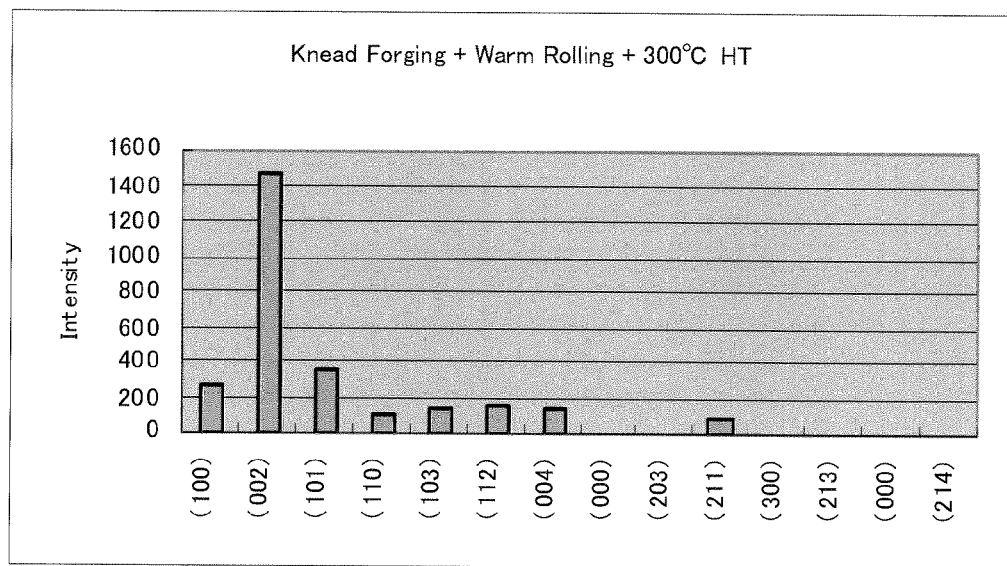
FIG. 9 is a diagram showing the peak of the crystal orientation of Example 4 of the present invention based on XRD.

Meanwhile, FIG. 9 shows the results of measuring the crystal orientation of the lanthanum target for sputtering obtained in this Example based on X-ray diffraction (XRD). In comparison to the lanthanum target of Comparative Example 1 described later, other than that the peak intensity of (101) was stronger than the peak intensity of (100), there was no significant difference in the results. Consequently, it is considered that the difference in crystal orientation does not greatly affect the generation of spotty macro patterns in the present invention.

In addition, the lanthanum target for sputtering was sputtered under the condition of 100 W power. Consequently, a uniform film was formed on the substrate without generating any particles. Moreover, even when sputtering was performed for a long period of time, favorable sputtering was enabled without the target floating from the backing plate and without any peeling between the target and the backing plate. Consequently, it was confirmed that diffusion bonding is effective for the copper-chromium alloy backing plate.

Comparative Example 1

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was hot pressed (HP) in a vacuum at a temperature of 800° C. to increase its diameter and form the shape into a rough target shape, and this was further subject to machining to obtain a disk-shaped target of $\phi 140 \times 14$ t. The weight of this target was 1.42 kg. This target was further diffusion-bonded to a copper backing plate to obtain a lanthanum target for sputtering. By way of reference, the Vickers hardness in this case was 51.

Figure 10:
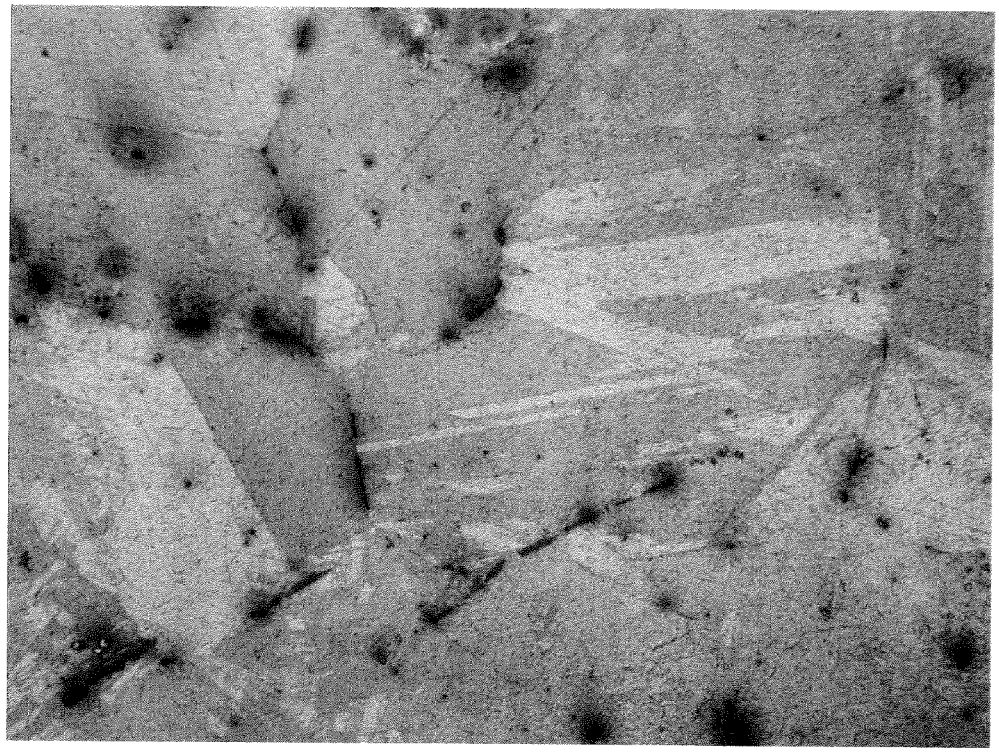
FIG. 10 is a micrograph (×100) of the machined target surface of the Comparative Example 1.

In order to observe the structure of the lanthanum target for sputtering obtained as described above, etching was performed using 1 wt % nitric acid aqueous solution. FIG. 10 shows the micrograph (×100) showing the results. As shown in FIG. 10, the structure of the target was a coarse crystal structure with a crystal grain size of 200 to 300 µm, and spotty macro patterns were observed on the surface of the lanthanum target for sputtering.

Figure 11:
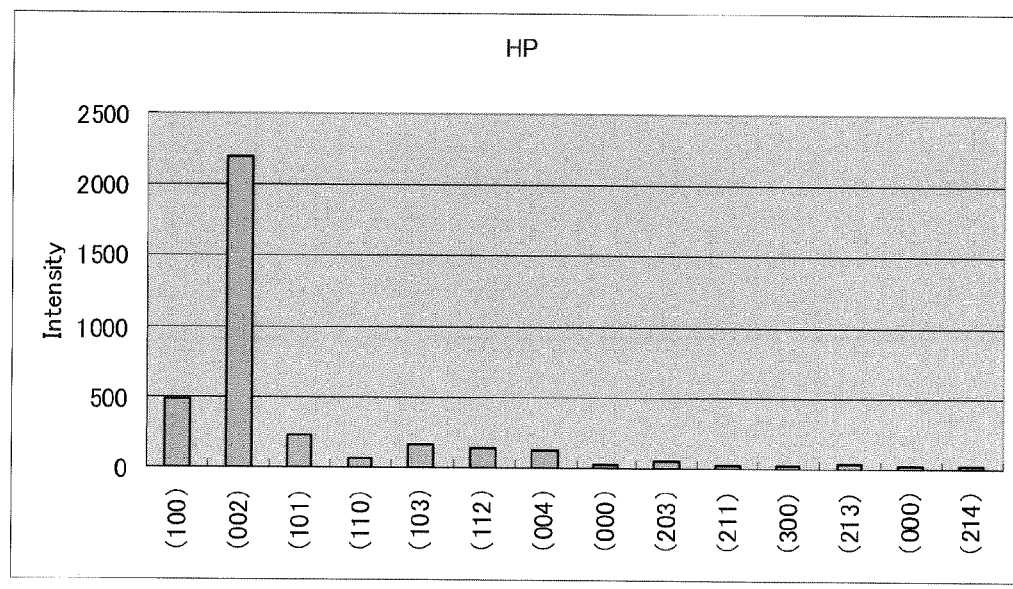
FIG. 11 is a diagram showing the peak of the crystal orientation of the Comparative Example 1 based on XRD.

Meanwhile, FIG. 11 shows the results of measuring the crystal orientation of the lanthanum target for sputtering obtained in this Comparative Example based on X-ray diffraction (XRD). In comparison to the lanthanum target of the foregoing Examples, other than that the peak intensity of (100) was stronger than the peak intensity of (101), there was no significant difference in the results. Consequently, it is considered that the difference in crystal orientation does not greatly affect the generation of spotty macro patterns in the present invention.

In addition, the lanthanum target for sputtering obtained in this Comparative Example was sputtered under the condition of 100 W power. Consequently, the generation of particles increased in comparison to the Examples, and the deposition to the substrate was not uniform.

Moreover, although there was no peeling between the target and the backing plate during the sputtering process, the target tended to slightly float from the backing plate. It is considered that this did not have a major effect since the sputtering time was short.

Nevertheless, when sputtering was performed for a long period of time, peeling occurred between the target and the backing plate as expected. Consequently, it was confirmed that it is preferable to use the copper-chromium alloy backing plate used in the Examples.

Comparative Example 2

Lanthanum having a purity of 99.9% was used as the lanthanum raw material. This raw material was melted with an EB melting furnace of 70 kW at vacuum of $6.0 \times 10^{-5}$ to $7.0 \times 10^{-4}$ mbar and melting output of 10 kW. This was further cast and cooled to prepare a lanthanum ingot.

Subsequently, the ingot was subject to knead forging in the atmosphere at a temperature of 600° C. and additionally subject to upset forging at a temperature of 300° C. to increase its diameter and form the shape into a rough target shape, and this was further subject to heat treatment at 180° C. for 1 hour to obtain a recrystallized structure.

This was further subject to machining to obtain a disk-shaped target of $\phi 140 \times 14$ t. The weight of this target was 1.42 kg. This target was further diffusion-bonded to a copper backing plate to obtain a lanthanum target for sputtering.

In order to observe the structure of the lanthanum target for sputtering obtained as described above, etching was performed using 1 wt % nitric acid aqueous solution. The structure of the target was a coarse crystal structure with a crystal grain size of 100 to 200 µm, and spotty macro patterns were observed on the surface of the lanthanum target for sputtering.

By way of reference, the Vickers hardness in this case was 55.

Meanwhile, the crystal orientation of the lanthanum target for sputtering obtained in this Comparative Example was measured based on X-ray diffraction (XRD). As with the lanthanum target of the foregoing Examples, the peak intensity of (101) was stronger than the peak intensity of (100). Consequently, it is considered that the crystal orientation does not greatly affect the generation of spotty macro patterns.

In addition, the lanthanum target for sputtering obtained in this Comparative Example was sputtered under the condition of 100 W power. Consequently, the generation of particles increased in comparison to the Examples, and the deposition to the substrate was not uniform.

Moreover, although there was no peeling between the target and the backing plate during the sputtering process, the target tended to slightly float from the backing plate. It is considered that this did not have a major effect since the sputtering time was short.

Nevertheless, when sputtering was performed for a long period of time, peeling occurred between the target and the backing plate as expected. Consequently, it was confirmed that it is preferable to use the copper-chromium alloy backing plate used in the Examples.

The lanthanum target for sputtering obtained with the present invention, which has a recrystallized structure with an average crystal grain size of 100 μm or less and has no spotty macro patterns on the surface, is free from the generation of particles during sputtering and enables uniform deposition. It is thereby possible to resolve the conventional problems, and a thin film obtained by sputtering the lanthanum target of the present invention is useful as an electronic material; particularly as a gate insulator film or a metal gate thin film.

The invention claimed is:

1. A lanthanum target for sputtering which has a diameter of 300 mm or more, a purity excluding gas components of 4N or higher, a recrystallized structure with an average crystal grain size of 10 μm or more and 100 μm or less, a Vickers hardness of 38 or more and 49 or less, and no structure exhibiting macroscopic spotty patterns in an etched surface thereof.

2. The lanthanum target for sputtering according to claim 1, wherein the target contains 1500 ppm by weight or less of oxygen.

3. The lanthanum target for sputtering according to claim 1, wherein the target contains less than 1000 ppm by weight in total of rare-earth elements other than La.

4. The lanthanum target for sputtering according to claim 1, wherein the target contains 100 ppm by weight or less of each of aluminum, iron and copper, 1 ppm by weight or less of each alkali metal element and each alkali earth metal element, and 10 ppb by weight or less of each radioactive element.

5. The lanthanum target for sputtering according to claim 1, further comprising a copper-chromium alloy backing plate diffusion bonded to the lanthanum target.

6. The lanthanum target for sputtering according to claim 1, wherein the average crystal grain size is 25 to 100 μm.

7. A method of producing a lanthanum target for sputtering, wherein lanthanum is melted and cast to produce an ingot, the ingot is subject to knead forging at a temperature of 300 to 500° C. and subsequently subject to upset forging at 300 to 500° C. to form the shape into a rough target shape, this is subject to heat treatment at a temperature of 150 to 300° C. to achieve recrystallization, and this is additionally subject to machining to obtain a target having a diameter of 300mm or more, a purity excluding gas components of 4N or higher, a recrystallized structure with an average crystal grain size of 10 μm or more and 100 μm or less, a Vickers hardness of 38 or more and 49 or less, and no structure exhibiting macroscopic spotty patterns when a surface thereof is subject to etching.

8. A method of producing a lanthanum target for sputtering, wherein lanthanum is melted and cast to produce an ingot, the ingot is subject to knead forging at a temperature of 300 to 500 ° C. and subsequently subject to warm rolling at 300 to 500° C. to form the shape into a rough target shape and achieve recrystallization, and this is additionally subject to machining to obtain a target having a diameter of 300 mm or more, a purity excluding gas components of 4N or higher, a recrystallized structure with an average crystal grain size of 10 μm or more and 100 μm or less, a Vickers hardness of 38 or more and 49 or less, and no structure exhibiting macroscopic spotty patterns when a surface thereof is subject to etching.

9. A method of producing a lanthanum target for sputtering, wherein lanthanum is melted and cast to produce an ingot, the ingot is subject to knead forging at a temperature of 300 to 500 ° C. and subsequently subject to warm rolling at 300 to 500° C. to form the shape into a rough target shape, this is subject to heat treatment at a temperature of 300 to 500 ° C. to achieve recrystallization, and this is additionally subject to machining to obtain a target having a diameter of 300 mm or more, a purity excluding gas components of 4N or higher, a recrystallized structure with an average crystal grain size of 10 μm or more and 100 μm or less, a Vickers hardness of 38 or more and 49 or less, and no structure exhibiting macroscopic spotty patterns when a surface thereof is subject to etching.

* * * * *